(12) United States Patent
Cheng et al.

(10) Patent No.: US 8,247,822 B2
(45) Date of Patent: Aug. 21, 2012

(54) SEMICONDUCTOR LIGHT-EMITTING DEVICE

(75) Inventors: Chih Ching Cheng, Taichung County (TW); Tzong Liang Tsai, Taichung County (TW); Shu Hui Lin, Taichung County (TW)

(73) Assignee: Huga Optotech Inc., Taichung County (TW)

( * ) Notice: Subject to any disclaimer, the term of this patent is extended or adjusted under 35 U.S.C. 154(b) by 166 days.

(21) Appl. No.: 12/856,221

(22) Filed: Aug. 13, 2010

(65) Prior Publication Data

US 2011/0001147 A1    Jan. 6, 2011

Related U.S. Application Data

(63) Continuation-in-part of application No. 12/327,367, filed on Dec. 3, 2008, now abandoned.

(30) Foreign Application Priority Data

Sep. 11, 2008    (TW) ................................ 97134801 A (51) Int. Cl.
  *H01L 27/15*    (2006.01)
(52) U.S. Cl. ................ 257/79; 257/13; 257/14; 257/88; 257/98; 257/E33.067; 257/E33.068; 257/E33.074; 438/22

(58) Field of Classification Search .................... 257/13, 257/14, 79, 88, 98, E33.067, E33.068, E33.074; 438/22
See application file for complete search history.

(56) References Cited

U.S. PATENT DOCUMENTS

| | | | |
|---|---|---|---|
| 2005/0179130 A1* | 8/2005 | Tanaka et al. ................ | 257/730 |
| 2008/0303042 A1* | 12/2008 | Minato et al. .................. | 257/98 |

FOREIGN PATENT DOCUMENTS

| | | |
|---|---|---|
| JP | 2005-101566 | 4/2005 |
| JP | 2008-177528 | 7/2008 |

OTHER PUBLICATIONS

Korean Office Action dated Sep. 5, 2010 for 10-2008-0130047, which is a corresponding Korean application, that cites JP2005-101566 and JP2008-177528.

* cited by examiner

*Primary Examiner* — A. Sefer
*Assistant Examiner* — Farid Khan
(74) *Attorney, Agent, or Firm* — WPAT, P.C.; Anthony King (57) ABSTRACT

A semiconductor light-emitting device comprises a substrate, a first conductive type semiconductor layer positioned on the substrate, a light-emitting structure positioned on the first conductive type semiconductor layer, and a second conductive type semiconductor layer positioned on the light-emitting structure. The substrate includes an upper surface and a plurality of protrusions positioned on the upper surface. Each of the protrusions includes a top surface, a plurality of wall surfaces, and a plurality of inclined surfaces sandwiched between the top surface and the wall surfaces.

20 Claims, 10 Drawing Sheets

SEMICONDUCTOR LIGHT-EMITTING DEVICE

The present application is a continuation-in-part of U.S. patent application Ser. No. 12/327,367, filed on Dec. 3, 2008, the disclosure of which is incorporated herein by reference.

BACKGROUND OF THE DISCLOSURE (A) Field of the Disclosure

The present disclosure relates to a semiconductor light-emitting device, and more particularly, to a semiconductor light-emitting device including a substrate having a plurality of protrusions configured to reflect light beams from a light-emitting structure at different angles so as to increase the light-extraction efficiency.

(B) Description of the Related Art

Semiconductor light-emitting devices such as light-emitting diodes (LED) have been widely used in traffic lights, vehicle electronics, LCD backing lights, and general illumination. In the light-emitting diode an n-type semiconductor layer, a light-emitting region and a p-type semiconductor layer are essentially made to grow on a substrate to form a layered structure, and the electrodes are formed on the p-type semiconductor layer and on the n-type semiconductor layer. Light is generated through the recombination of holes and electrons that have been injected through the semiconductor layers to the light-emitting region, and then emitted through a light transmitting electrode on the p-type semiconductor layer or from the substrate. The material used for preparing the visible light-emitting diode includes the III-V compound such as AlGaInP for green, yellow, orange or red light-emitting diodes, and GaN for blue or ultraviolet light-emitting diodes, wherein the GaN light-emitting diode is formed on the sapphire substrate.

Extracting the light beams generated by the light-emitting layer to the outside of the light-emitting device is one important issue to be improved in the semiconductor light-emitting device. Researchers use the transparent electrode in the conventional light-emitting device to prevent the upward light beams generated by the light-emitting layer from being blocked on the propagation path to the outside of the light-emitting device, or use the reflection layer to reflect the downward light beams generated by the light-emitting layer back to the top of the light-emitting device. However, in addition to the upward light beams and downward light beams, the light-emitting layer also emits light beams in other directions, and a portion of the light beams are reflected internally into the light-emitting device due to the total reflection effect. Consequently, the light beams may be adsorbed by the light-emitting layer, rather than propagate to the outside of the light-emitting device.

TW 561632 discloses a semiconductor light-emitting device having at least one recess and/or protruding portion created for scattering or diffracting light generated in a light-emitting region on the surface portion of a substrate. The recess and/or protruding portion has a shape that prevents crystal defects from occurring in semiconductor layers. In addition, TW 536841 discloses a semiconductor light-emitting element having an undulation formed on the surface of a first layer (substrate), and a second layer having a refractory index different from that of the first layer grown to fill the undulation. Furthermore, a first crystal may be grown in an undulated shape on a crystal layer, which is the foundation of crystal growth. After such undulated refractory interface is formed, a semiconductor crystal layer having a refractory index different from that of the first layer is laminated thereon.

US 20050179130 discloses a semiconductor light emitting element on a patterned substrate, wherein the substrate has at least one recess and/or protrusion formed on the surface thereof so as to scatter or diffract the light generated in an active layer. However, the sloped surfaces of the protrusion has notches, and it is well-known that the notches result in the generation of voids in the semiconductor layer formed by the epitaxy process on the protrusions, and the voids in the semiconductor layer affects the light-extraction efficiency.

SUMMARY OF THE DISCLOSURE

One aspect of the present disclosure provides a semiconductor light-emitting device including a substrate having a plurality of protrusions configured to reflect light beams from a light-emitting structure at different angles so as to increase the light-extraction efficiency.

A semiconductor light-emitting device according to this aspect of the present disclosure comprises a substrate, a first conductive type semiconductor layer positioned on the substrate, a light-emitting structure positioned on the first conductive type semiconductor layer, and a second conductive type semiconductor layer positioned on the light-emitting structure. The substrate includes an upper surface and a plurality of protrusions positioned on the upper surface of the substrate. Each of the protrusions includes a top surface, a plurality of wall surfaces, and a plurality of inclined surfaces sandwiched between the top surface and the wall surfaces. The wall surface, the inclined surface, and the top surface of the protrusion have different inclined angles configured to reflect the light beams generated by the light-emitting structure at different reflection angles. Consequently, the repeated internal reflection of the light beams in the light-emitting device is decreased dramatically to prevent the light beams from being adsorbed by the light-emitting structure, so as to improve the light extraction efficiency.

Another aspect of the present disclosure provides a method for preparing a semiconductor light-emitting device comprising a substrate, a first conductive type semiconductor layer positioned on the substrate, a light-emitting structure positioned on the first conductive type semiconductor layer, and a second conductive type semiconductor layer positioned on the light-emitting structure. The substrate includes an upper surface and a plurality of protrusions positioned on the upper surface, wherein each of the protrusions includes a ridge portion having a plurality of branches, a plurality of wall surfaces sandwiched between the branches, a plurality of inclined surfaces positioned on the free ends of the branches, with the free ends being adjacent to the upper surface. The ridge portion, the wall surface, the inclined surface, and the top surface of the protrusion have different inclined angles configured to reflect the light beams generated by the light-emitting structure at different reflection angles. Consequently, the repeated internal reflection of the light beams in the light-emitting device is decreased dramatically to prevent the light beams from being adsorbed by the light-emitting structure, so as to improve the light extraction efficiency.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

The objectives and advantages of the present disclosure will become apparent upon reading the following description and upon reference to the accompanying drawings in which.

DETAILED DESCRIPTION OF THE DISCLOSURE

Figure 1:
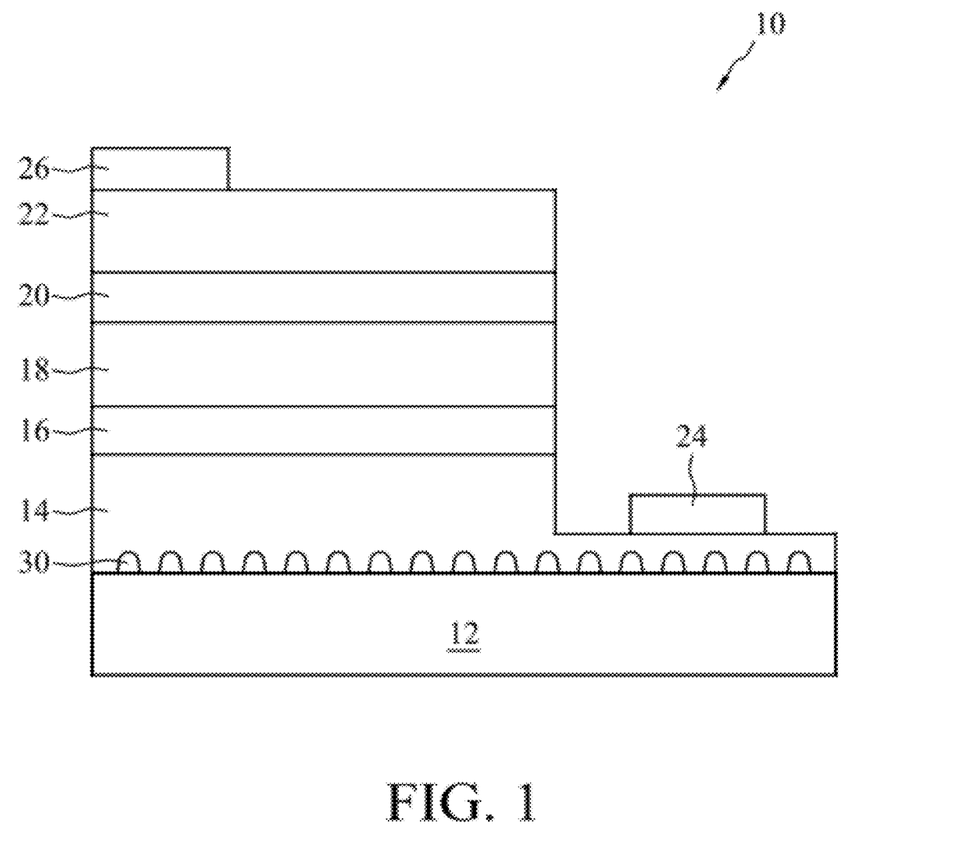
FIG. 1 illustrates the cross-sectional view of a light-emitting device according to a first embodiment of the present disclosure.
Figure 2:
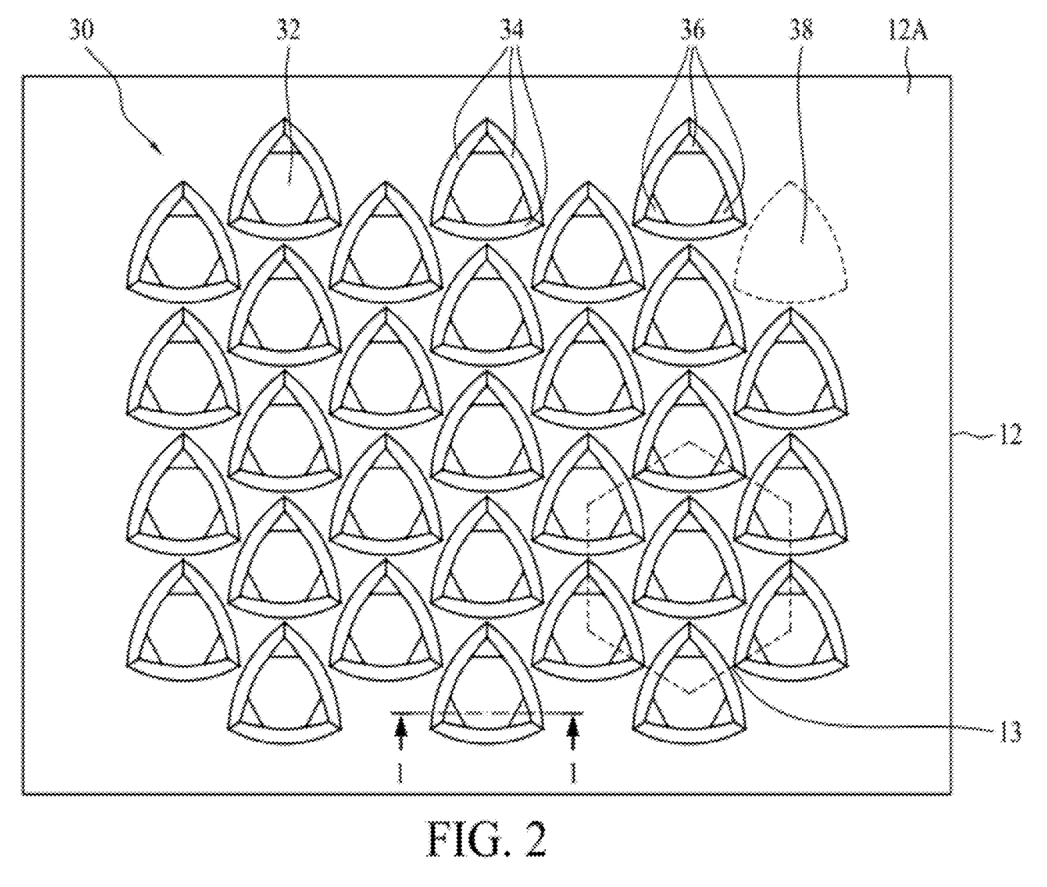
FIG. 2 illustrates a three-dimensional view of a substrate according to a first embodiment of the present disclosure.
Figure 3:
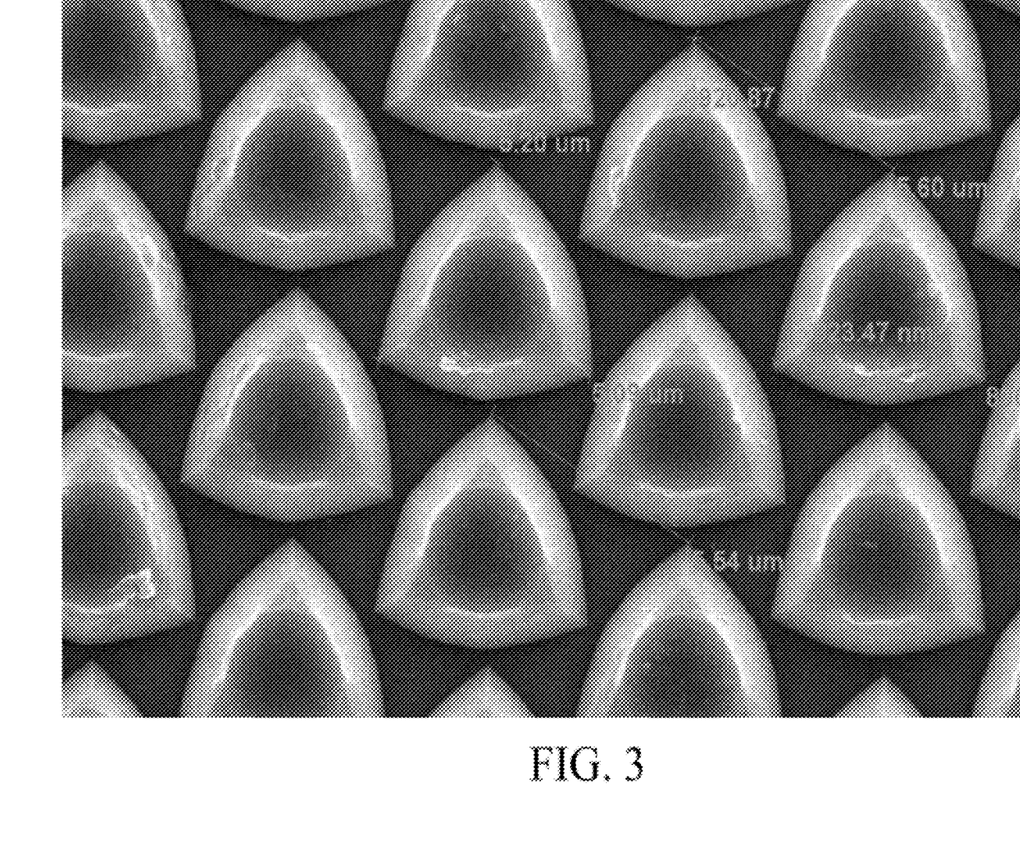
FIG. 3 illustrates a scanning electron microscope (SEM) image of a substrate according to a first embodiment of the present disclosure.

FIG. 1 to FIG. 3 illustrate a semiconductor light-emitting device 10 according to a first embodiment of the present disclosure. Referring to FIG. 1, the semiconductor light-emitting device 10 comprises a substrate 12, an n-type semiconductor layer 14 positioned on the substrate 12, a light-emitting structure 16 positioned on the n-type semiconductor layer 14, a p-type semiconductor layer 18 positioned on the light-emitting structure 16, a contact layer 20 positioned on the p-type semiconductor layer 18, a transparent conductive layer 22 positioned on the contact layer 20, a first electrode 24 positioned on the n-type semiconductor layer 14, and a second electrode 26 positioned on the transparent conductive layer 22.

Referring to FIG. 2 and FIG. 3, in one embodiment of the present disclosure the substrate 12 includes an upper surface 12A and a plurality of protrusions 30 positioned on the upper surface 12A. Each protrusion 30 includes a top surface 32, three wall surfaces 34, and three inclined surfaces 36 sandwiched between the top surface 32 and the wall surfaces 34. The wall surfaces 34 and the inclined surfaces 36 of the protrusion 30 have different inclined angles, which is the included angle between the upper surface 12A and the wall surface 34 (or the inclined surface 36). The wall surface 34 and the inclined surface 36 are connected, and the included angle between the inclined surface 36 and the wall surface 34 is between 90 and 180 degrees.

The different inclined angles are configured to reflect the light beams generated by the light-emitting structure 16 at different reflection angles. In addition, the protrusion 30 has a base surface 38 having three corners, and the connection of the corners is arc-shaped, i.e., the wall surface 34 is arc-shaped. The wall surface 34, the inclined surface 36, and the top surface 32 can reflect the light beams generated by the light-emitting structure 16 at any angle to the outside of the light-emitting device 10. Consequently, the repeated internal reflection of the light beams in the light-emitting device 10 is decreased dramatically to prevent the light beams from being adsorbed by the light-emitting structure 16, so as to improve the light extraction efficiency. In particular, the cross-sectional shape of the protrusion 30 on the substrate 12 in FIG. 1 is shown as a cross-sectional view along the cross-sectional line 1-1 in FIG. 2.

In one embodiment of the present invention, the wall surfaces 34 are convex substantially without notches; therefore, the wall surfaces 34 can scatter or diffract the incident light at any angle. In contrast, the protrusion disclosed in US 20050179130 has notches formed along the sloped side face and reaches the top face of the protrusion, and the notches result in the generation of voids in the semiconductor layer formed on the protrusions, and the voids in the semiconductor layer affects the light-extraction efficiency.

In addition, the protrusion disclosed in US 20050179130 does not have surfaces corresponding to the inclined surfaces 36 sandwiched between the top surface 32 and the wall surfaces 34 of the present disclosure, and the additional inclined surfaces 36 of the present disclosure function additionally to scatter or diffract the incident light to increase the light-extraction efficiency. Therefore, the protrusion of the present disclosure obviously has a superior light-extraction efficiency to the protrusion disclosed in US 20050179130.

In one embodiment of the present disclosure, the centers of the top surface 32 of adjacent six protrusions 30 in a ring manner form a hexagon 13, and the area of the inclined surfaces 36 inside the hexagon 13 is between 1% and 5% of the area of the hexagon 13. In one embodiment of the present disclosure, the area of the inclined surfaces 36 of etch protrusion 30 is between 2% and 5% of the area of the base surface 38. In one embodiment of the present disclosure, the protrusions 30 are formed by the wet etching process, the wall surfaces 34 are convex substantially without notches, and the roughness Ra of the wall surfaces 34 is substantially smaller than 0.01 um, preferably smaller than 0.005 um.

In one embodiment of the present disclosure, the substrate 12 includes transparent insulation material such as sapphire; the n-type semiconductor layer 14, the light-emitting structure 16 and the p-type semiconductor layer 18 include nitride material such as aluminum-gallium-nitride (AlGaN), gallium nitride (GaN), indium-gallium nitride (InGaN), or aluminum-gallium-indium nitride (AlGaInN); the contact layer 20 includes nitride material such as aluminum-gallium-nitride (AlGaN), gallium nitride (GaN), indium-gallium nitride (InGaN), or aluminum-gallium-indium nitride (AlGaInN); the transparent conductive layer 22 includes indium oxide, tin oxide or indium tin oxide; and the light-emitting structure 16 may use the quantum well or multi-quantum well structure. In particular, the epitaxy machine can fabricate these layers on the substrate 12.

Figure 4:
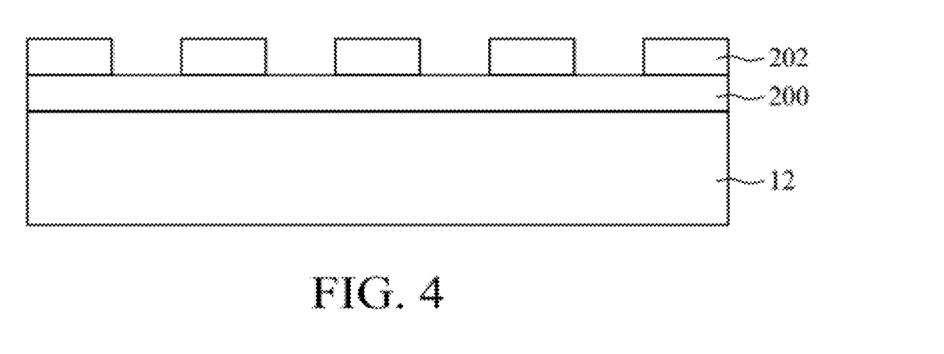
FIG. 4 to FIG. 7 illustrates a method for preparing the substrate with protrusions on the upper surface according to one embodiment of the present disclosure.
Figure 5:
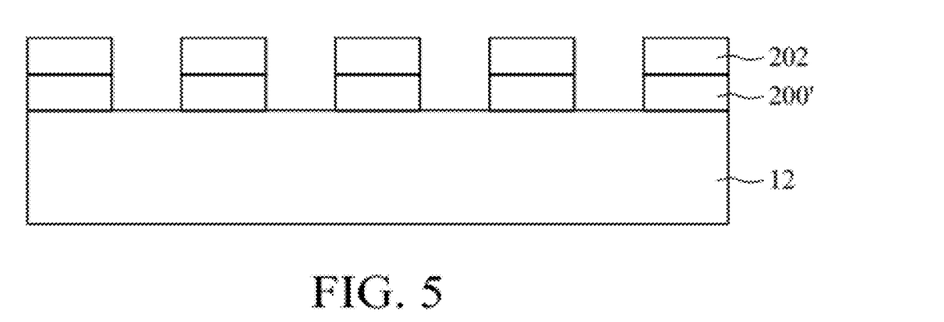

FIG. 4 to FIG. 7 illustrates a method for preparing the substrate 12 with protrusions 30 on the upper surface 12 according to one embodiment of the present disclosure. Referring to FIG. 4, a deposition process is performed to form a dielectric layer 200 such as silicon oxide layer on the substrate 12, and a photolithographic process is then performed to form a photoresist layer 202 on the dielectric layer 200. Subsequently, an etching process is performed using the photoresist layer 202 as the etching mask to remove a portion of the dielectric layer 200 not covered by the photoresist layer 202 to form a hard mask 200' on the substrate 12, as shown in FIG. 5.

Figure 6:
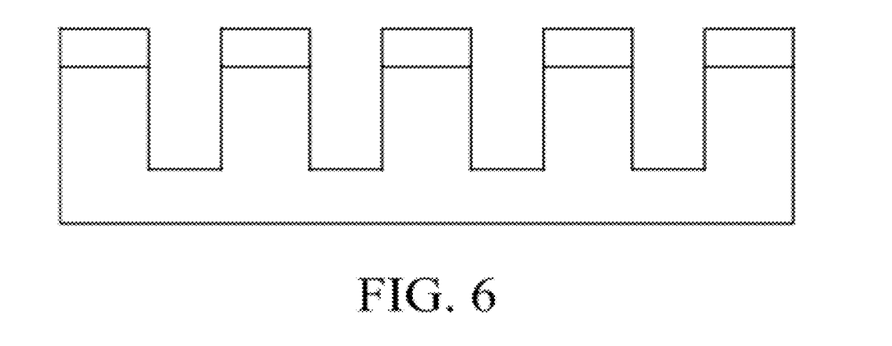
Figure 7:
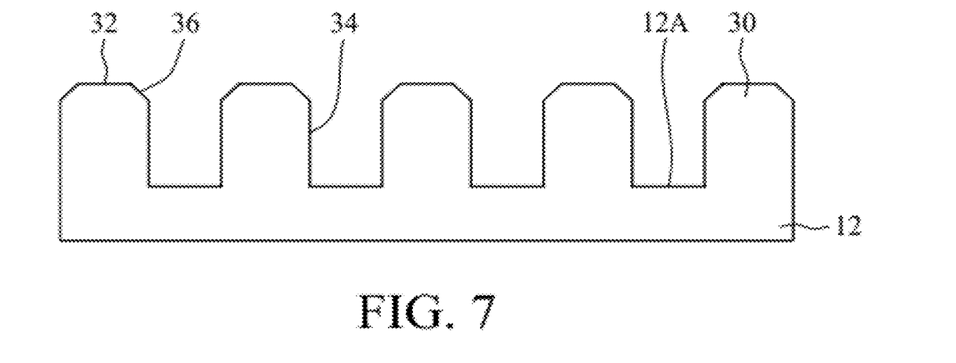

Referring to FIG. 6, after stripping the photoresist layer 202, a wet etching process is performed to remove a portion of the substrate 12 not covered by the hard mask 200'. Subsequently, the hard mask 200' is removed to complete the patterning of the substrate 12 with protrusions 30 on the upper surface 12, as shown in FIG. 7. In one embodiment of the present disclosure, the substrate 12 is a sapphire substrate, the hard mask 200' includes circular patterns each covering a circular area of the substrate 12, the wet etching process uses an etchant including sulfuric acid and phosphoric acid, and the wet etching process is performed at a temperature between 200 and 300° C. for 10 to 30 min.

Consequently, the etching rate of the etchant in one crystal orientation is different from that in another crystal orientation due to the crystalline effect of the sapphire substrate, and the present disclosure uses this unique property to prepare the substrate 12 with protrusions 30. In particular, the fabrication of the protrusion with excellent light-extraction property is very simple without substantial increasing the number of fabrication processes, which can be excellently applied to mass production. In one embodiment of the present disclosure, the top surface 32 of the substrate 12 is a C-plane, and the inclined surface 36 of the substrate 12 is an R-plane.

Figure 8:
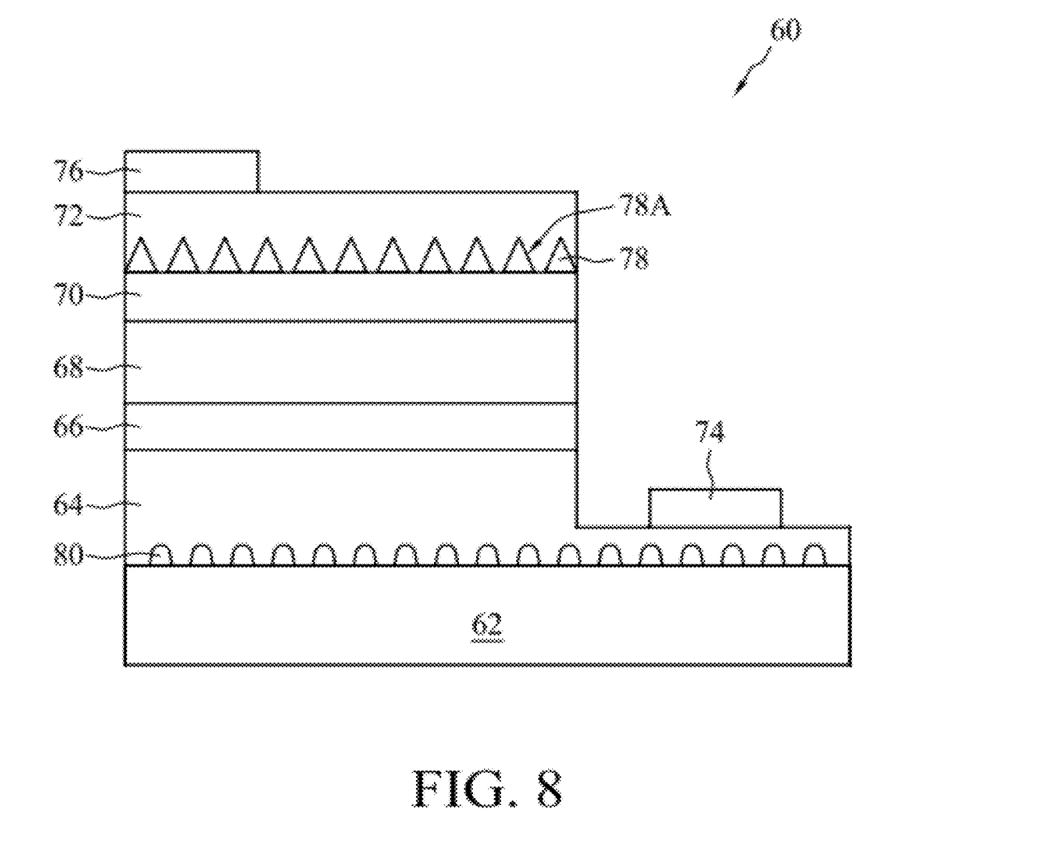
FIG. 8 illustrates the cross-sectional view of a light-emitting device according to a second embodiment of the present disclosure.
Figure 9:
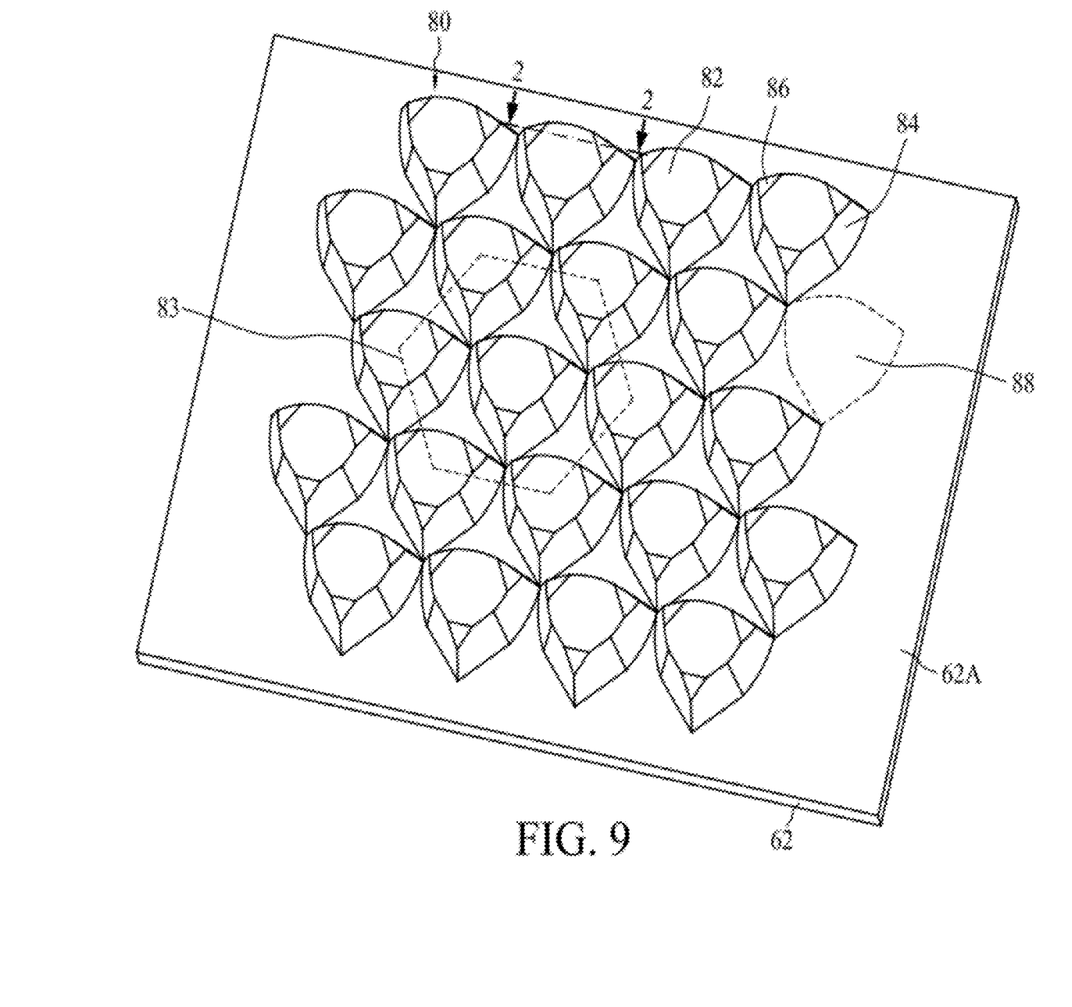
FIG. 9 illustrates a three-dimensional view of a substrate according to a second embodiment of the present disclosure.

FIG. 8 and FIG. 9 illustrate a semiconductor light-emitting device 60 according to a second embodiment of the present disclosure. Referring to FIG. 8, the semiconductor light-emitting device 60 comprises a substrate 62, an n-type semiconductor layer 64 positioned on the substrate 62, a light-emitting structure 66 positioned on the n-type semiconductor layer 64, a p-type semiconductor layer 68 positioned on the light-emitting structure 66, a contact layer 70 positioned on the p-type semiconductor layer 68, a nitride crystal layer 78 positioned on the contact layer 70, a transparent conductive layer 72 positioned on the nitride crystal layer 78, a first electrode 74 positioned on the n-type semiconductor layer 64, and a second electrode 76 positioned on the transparent conductive layer 72. In one embodiment of the present disclosure, the nitride crystal layer 78 includes a plurality of protrusions 78A configured to increase the light beams propagating from the light-emitting structure 66 to the outside of the light-emitting device 60 so as to improve the light-emitting efficiency.

Referring to FIG. 9, in one embodiment of the present disclosure, the substrate 62 includes an upper surface 62A and a plurality of protrusions 80 positioned on the upper surface 62A. Each protrusion 80 includes a top surface 82, five wall surfaces 84, and three inclined surfaces 86 sandwiched between the top surface 82 and the wall surfaces 84. The wall surface 84 and the inclined surface 86 of the protrusion 80 have different inclined angles, which is the included angle between the upper surface 62A and the wall surface 84 (or the inclined surface 86). The wall surface 84 and the inclined surface 86 are connected, and the included angle between the inclined surface 86 and the wall surface 84 is between 90 and 180 degrees.

The different inclined angles are configured to reflect the light beams generated by the light-emitting structure 66 at different reflection angles. In addition, the protrusion 80 has a base surface 88 having five corners, and the connection of the corners is arc-shaped, i.e., the wall surface 84 is arc-shaped. The wall surface 84, the inclined surface 86, and the top surface 82 can reflect the light beams generated by the light-emitting structure 66 at any angle to the outside of the light-emitting device 60. Consequently, the repeated internal reflection of the light beams in the light-emitting device 60 is decreased dramatically to prevent the light beams from being adsorbed by the light-emitting structure 66, so as to improve the light extraction efficiency. In particular, the cross-sectional shape of the protrusion 80 on the substrate 62 in FIG. 8 is shown as a cross-sectional view along the cross-sectional line 2-2 in FIG. 9.

In one embodiment of the present invention, the wall surfaces 84 are convex substantially without notches; therefore, the wall surfaces 84 can scatter or diffract the incident light at any angle. In contrast, the protrusion disclosed in US 20050179130 has notches formed along the sloped side face and reaches the top face of the protrusion, and the notches result in the generation of voids in the semiconductor layer formed on the protrusions, and the voids in the semiconductor layer affects the light-extraction efficiency.

In addition, the protrusion disclosed in US 20050179130 does not have surfaces corresponding to the inclined surfaces 86 sandwiched between the top surface 82 and the wall surfaces 84 of the present disclosure, and the additional inclined surfaces 86 of the present disclosure function additionally to scatter or diffract the incident light to increase the light-extraction efficiency. Therefore, the protrusion of the present disclosure obviously has a superior light-extraction efficiency to the protrusion disclosed in US 20050179130.

In one embodiment of the present disclosure, the centers of the top surface 82 of adjacent six protrusions 80 in a ring manner form a hexagon 83, and the area of the inclined surfaces 86 inside the hexagon 83 is between 1% and 5% of the area of the hexagon 83. In one embodiment of the present disclosure, the area of the inclined surfaces 86 of etch protrusion 80 is between 2% and 5% of the area of the base surface 88. In one embodiment of the present disclosure, the protrusions 80 are formed by the wet etching process, the wall surfaces 84 are convex substantially without notches, and the roughness Ra of the wall surfaces 84 is substantially smaller than 0.01 um, preferably smaller than 0.005 um.

In one embodiment of the present disclosure, the substrate 62 includes transparent insulation material such as sapphire; the n-type semiconductor layer 64, the light-emitting structure 66 and the p-type semiconductor layer 68 include nitride material such as aluminum-gallium-nitride (AlGaN), gallium nitride (GaN), indium-gallium nitride (InGaN), or aluminum-gallium-indium nitride (AlGaInN); the contact layer 70 includes nitride material such as aluminum-gallium-nitride (AlGaN), gallium nitride (GaN), indium-gallium nitride (InGaN), or aluminum-gallium-indium nitride (AlGaInN); the transparent conductive layer 72 includes indium oxide, tin oxide or indium tin oxide; and the light-emitting structure 66 may use the quantum well or multi-quantum well structure. In particular, the epitaxy machine can fabricate these layers on the substrate 62.

Another aspect of the present disclosure provides a method for preparing a semiconductor light-emitting device comprising a substrate, a first conductive type semiconductor layer positioned on the substrate, a light-emitting structure positioned on the first conductive type semiconductor layer, and a second conductive type semiconductor layer positioned on the light-emitting structure. The substrate includes an upper surface and a plurality of protrusions positioned on the upper surface, wherein each of the protrusions includes a ridge portion having a plurality of branches, a plurality of wall surfaces sandwiched between the branches, and a plurality of inclined surfaces positioned on the free ends of the branches, with the free ends being adjacent to the upper surface. The ridge portion, the wall surface, the inclined surface, and the top surface of the protrusion have different inclined angles configured to reflect the light beams generated by the light-emitting structure at different reflection angles. Consequently, the repeated internal reflection of the light beams in the light-emitting device is decreased dramatically to prevent the light beams from being adsorbed by the light-emitting structure, so as to improve the light extraction efficiency.

Figure 10:
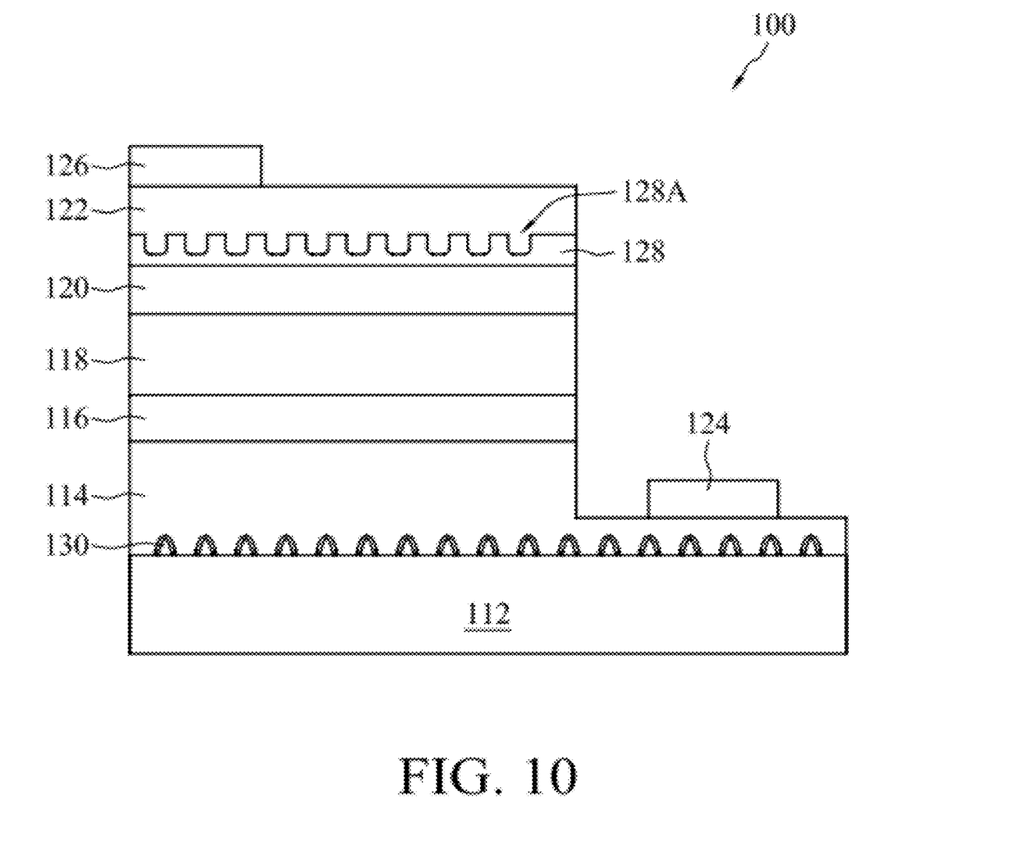
FIG. 10 illustrates the cross-sectional view of a light-emitting device according to a third embodiment of the present disclosure.
Figure 11:
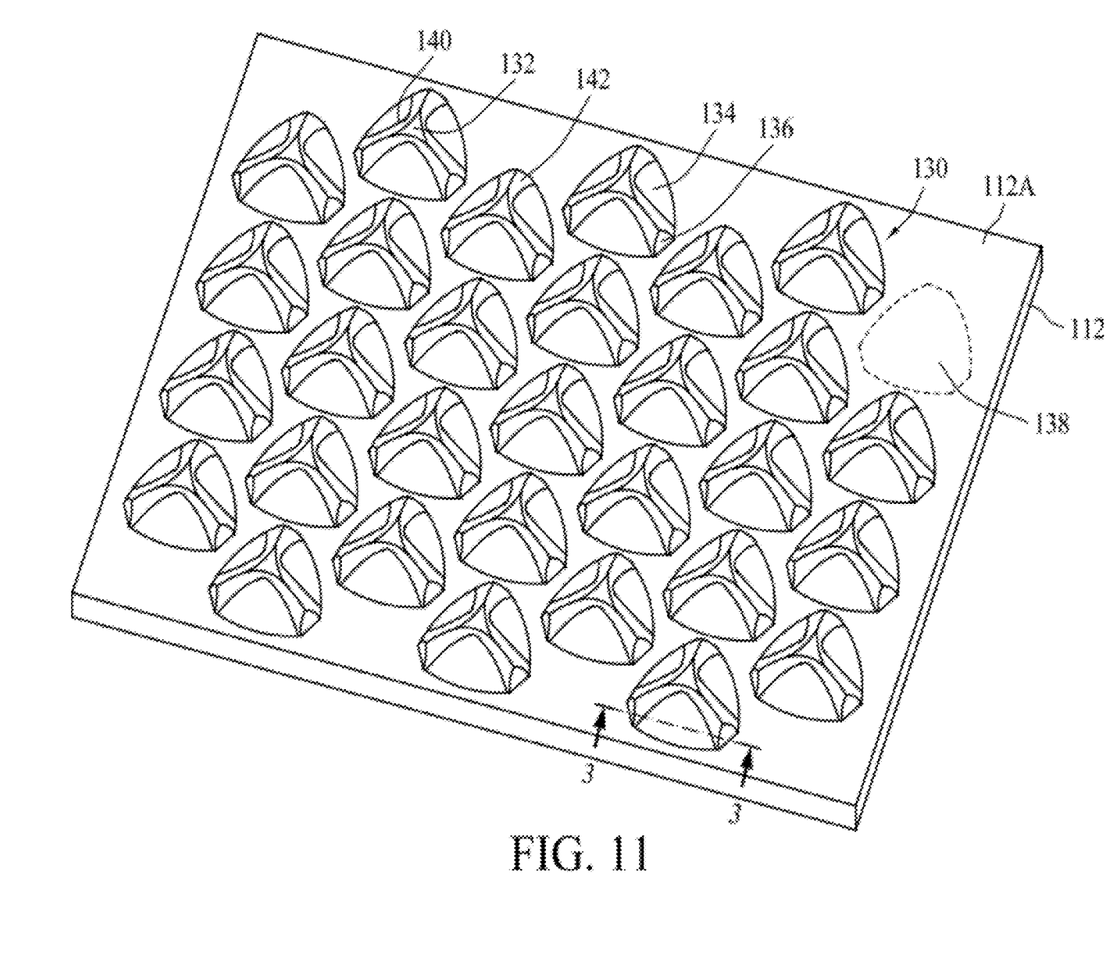
FIG. 11 illustrates a three-dimensional view of a substrate according to a third embodiment of the present disclosure.
Figure 12:
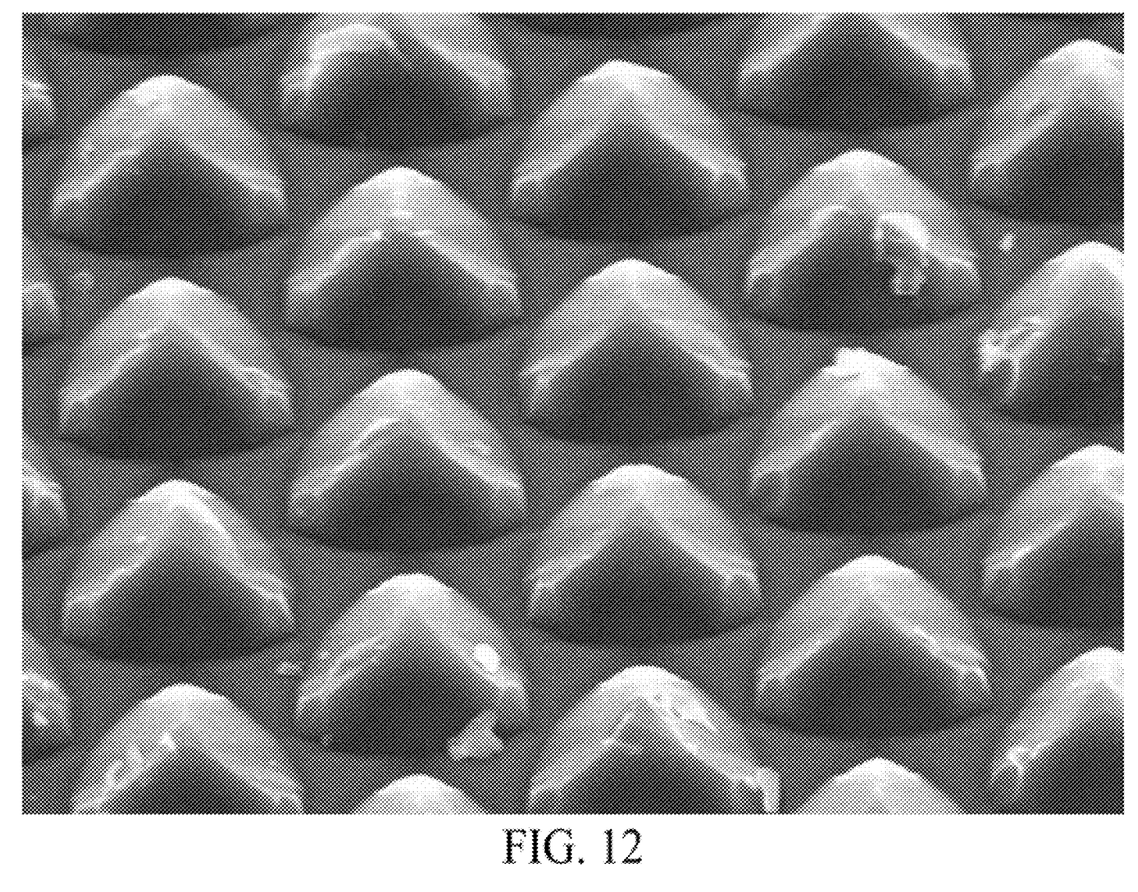
FIG. 12 illustrates a scanning electron microscope (SEM) image of a substrate according to a third embodiment of the present disclosure.

FIG. 10 to FIG. 12 illustrate a semiconductor light-emitting device 100 according to a third embodiment of the present disclosure. Referring to FIG. 10, the semiconductor light-emitting device 100 comprises a substrate 112, an n-type semiconductor layer 114 positioned on the substrate 112, a light-emitting structure 116 positioned on the n-type semiconductor layer 114, a p-type semiconductor layer 118 positioned on the light-emitting structure 116, a contact layer 120 positioned on the p-type semiconductor layer 118, a nitride crystal layer 128 positioned on the contact layer 120, a transparent conductive layer 122 positioned on the nitride crystal layer 128, a first electrode 124 positioned on the n-type semiconductor layer 114, and a second electrode 126 positioned on the transparent conductive layer 122. In one embodiment of the present disclosure, the nitride crystal layer 128 includes a plurality of depressions 128A configured to increase the light beams propagating from the light-emitting structure 116 to the outside of the light-emitting device 100 so as to improve the light-emitting efficiency.

Referring to FIG. 11 and FIG. 12, in one embodiment of the present disclosure, the substrate 112 includes an upper surface 112A and a plurality of protrusions 130 positioned on the upper surface 112A. Each protrusion 130 includes a top surface 132, a ridge portion 140, a plurality of wall surfaces 134, and a plurality of inclined surfaces 136. The ridge portion 140 has a plurality of branches 142, the wall surfaces 134 are sandwiched between the branches 142, and the inclined surfaces 136 are positioned on free ends of the branches 142, with the free ends being adjacent to the upper surface 112A. In one embodiment of the present disclosure, the ridge portion 140 includes three branches 142, and the protrusion 130 includes three wall surfaces 134 and three inclined surfaces 136. The top surface 132 of the protrusion 130 connects the branches 142, i.e., the top surface 133 is sandwiched among the branches 142. In addition, the top surface 132 can be dart-shaped, and the ridge portion 140 is above the wall surface 134. In particular, the wall surfaces 134 are convex substantially without notches; therefore, the wall surfaces 134 can scatter or diffract the incident light at any angle. In contrast, the protrusion disclosed in US 20050179130 has notches formed along the sloped side face and reaches the top face of the protrusion, and the notches result in the generation of voids in the semiconductor layer formed on the protrusions, and the voids in the semiconductor layer affects the light-extraction efficiency.

The wall surface 134 and the inclined surface 136 of the protrusion 130 have different inclined angles, which is the included angle between the upper surface 112A and the wall surface 134 (or the inclined surface 136). The wall surface 134 and the inclined surface 136 are connected, and the included angle between the inclined surface 136 and the wall surface 134 is between 90 and 180 degrees. The different inclined angles are configured to reflect the light beams generated by the light-emitting structure 116 at different reflection angles. In addition, the protrusion 130 has a base surface 138 having three corners, and the connection of the corners is arc-shaped, i.e., the wall surface 134 is arc-shaped.

The ridge portion 140, the wall surface 134, the inclined surface 136, and the top surface 132 can reflect the light beams generated by the light-emitting structure 116 at any angle to the outside of the light-emitting device 100. Consequently, the repeated internal reflection of the light beams in the light-emitting device 100 is decreased dramatically to prevent the light beams from being adsorbed by the light-emitting structure 116, so as to improve the light extraction efficiency. In particular, the cross-sectional shape of the protrusion 130 on the substrate 112 in FIG. 9 is shown as a cross-sectional view along the cross-sectional line 3-3 in FIG. 10.

In one embodiment of the present disclosure, the substrate 112 includes transparent insulation material such as sapphire; the n-type semiconductor layer 114, the light-emitting structure 116 and the p-type semiconductor layer 118 include nitride material such as aluminum-gallium-nitride (AlGaN), gallium nitride (GaN), indium-gallium nitride (InGaN), or aluminum-gallium-indium nitride (AlGaInN); the contact layer 120 includes nitride material such as aluminum-gallium-nitride (AlGaN), gallium nitride (GaN), indium-gallium nitride (InGaN), or aluminum-gallium-indium nitride (AlGaInN); the transparent conductive layer 122 includes indium oxide, tin oxide or indium tin oxide; and the light-emitting structure 116 may use the quantum well or multi-quantum well structure. In particular, the epitaxy machine can fabricate these layers on the substrate 112.

The preparation of the substrate 112 with protrusions 130 on the upper surface 112A includes performing the processes shown in FIG. 4 to FIG. 7, and another wet etching process is performed after the hard mask 200' is removed to form the substrate 112 with protrusions 130 by using the etching rate difference to remove a portion of the substrate 112 without the hard mask 200'.

In particular, it should be appreciated by those skilled in the art that the substrate 12 and the protrusion 30 in the light-emitting device 10 of the first embodiment, the substrate 62 and the protrusion 80 in the light-emitting device 60 of the second embodiment, and the substrate 112 and the protrusion 130 in the light-emitting device 100 of the third embodiment can be used to replaced each other.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor light-emitting device, comprising:
   a substrate including an upper surface and a plurality of protrusions positioned on the upper surface, wherein each of the protrusions includes a top surface, a plurality of wall surfaces, and a plurality of inclined surfaces sandwiched between the top surface and the wall surfaces;

a first conductive type semiconductor layer positioned on the substrate;

a light-emitting structure positioned on the first conductive type semiconductor layer; and a second conductive type semiconductor layer positioned on the light-emitting structure;

wherein the centers of the top surface of adjacent six protrusions in a ring manner form a hexagon, and the area of the inclined surfaces inside the hexagon is between 1% and 5% of the area of the hexagon.

2. The semiconductor light-emitting device of claim 1, wherein the inclined surface and the wall surface have different inclined angles.

3. The semiconductor light-emitting device of claim 1, wherein the inclined surface connects to the wall surface, and the included angle between the inclined surface and the wall surface is between 90 and 180 degrees.

4. The semiconductor light-emitting device of claim 1, wherein the wall surface is arc-shaped.

5. The semiconductor light-emitting device of claim 4, wherein the base surface of the protrusion comprises a plurality of corners, and wherein the connection of the corners is arc-shaped.

6. The semiconductor light-emitting device of claim 1, wherein the protrusion includes five wall surfaces.

7. The semiconductor light-emitting device of claim 6, wherein the base surface of the protrusion comprises a plurality of corners, and wherein the connection of the corners is arc-shaped.

8. The semiconductor light-emitting device of claim 1, wherein the area of the inclined surfaces of the protrusion is between 2% and 5% of the area of the base surface of the protrusion.

9. The semiconductor light-emitting device of claim 1, wherein the wall surfaces are convex substantially without notches.

10. A semiconductor light-emitting device, comprising:
a substrate including an upper surface and a plurality of protrusions positioned on the upper surface, wherein each of the protrusions includes a ridge portion having a plurality of branches, a plurality of wall surfaces, and a plurality of inclined surfaces positioned on free ends of the branches, with the free ends being adjacent to the upper surface;

a first conductive type semiconductor layer positioned on the substrate;

a light-emitting structure positioned on the first conductive type semiconductor layer; and a second conductive type semiconductor layer positioned on the light-emitting structure.

11. The semiconductor light-emitting device of claim 10, wherein the inclined surface and the wall surface have different inclined angles.

12. The semiconductor light-emitting device of claim 10, wherein the inclined surface connects the wall surface.

13. The semiconductor light-emitting device of claim 10, wherein the wall surface is arc-shaped.

14. The semiconductor light-emitting device of claim 10, wherein the protrusion includes a bottom surface having at least three corners.

15. The semiconductor light-emitting device of claim 14, wherein the connection of the corners is arc-shaped.

16. The semiconductor light-emitting device of claim 10, wherein the protrusion includes a top surface connecting the branches.

17. The semiconductor light-emitting device of claim 16, wherein the top surface is dart-shaped.

18. The semiconductor light-emitting device of claim 10, wherein the ridge portion is above the wall surface.

19. The semiconductor light-emitting device of claim 10, wherein the wall surfaces are convex substantially without notches.

20. A semiconductor light-emitting device, comprising:
a substrate including an upper surface and a plurality of protrusions positioned on the upper surface, wherein each of the protrusions includes a top surface, a plurality of wall surfaces, and a plurality of inclined surfaces sandwiched between the top surface and the wall surfaces;

a first conductive type semiconductor layer positioned on the substrate;

a light-emitting structure positioned on the first conductive type semiconductor layer; and a second conductive type semiconductor layer positioned on the light-emitting structure;

wherein the area of the inclined surfaces of the protrusion is between 2% and 5% of the area of the base surface of the protrusion.

* * * * *